(12) United States Patent
Garcia

(10) Patent No.: US 11,536,304 B2
(45) Date of Patent: Dec. 27, 2022

(54) CLAMP ASSEMBLY

(71) Applicant: Hubbell Incorporated, Shelton, CT (US)

(72) Inventor: Jafet Garcia, Col Santa Ana Tlapaltitlan (MX)

(73) Assignee: Hubbell Incorporated, Shelton, CT (US)

( * ) Notice: Subject to any disclaimer, the term of this patent is extended or adjusted under 35 U.S.C. 154(b) by 315 days.

(21) Appl. No.: 16/619,823

(22) PCT Filed: Jun. 14, 2018

(86) PCT No.: PCT/US2018/037594
§ 371 (c)(1),
(2) Date: Dec. 5, 2019

(87) PCT Pub. No.: WO2018/232151
PCT Pub. Date: Dec. 20, 2018

(65) Prior Publication Data
US 2020/0102976 A1    Apr. 2, 2020

Related U.S. Application Data

(60) Provisional application No. 62/519,546, filed on Jun. 14, 2017.

(51) Int. Cl.
*F16B 5/06* (2006.01)
*H05K 7/02* (2006.01)

(52) U.S. Cl.
CPC ............. *F16B 5/0621* (2013.01); *H05K 7/02* (2013.01)

(58) Field of Classification Search
CPC .......... F16B 5/0621; H02G 3/32; F16L 3/237; H05K 7/02
See application file for complete search history.

(56) References Cited

U.S. PATENT DOCUMENTS

| | | | |
|---|---|---|---|
| 2,077,613 A * | 4/1937 | Bondeson | H01R 4/643 439/100 |
| 2,768,232 A | 10/1956 | Kwake | |
| 4,339,167 A | 7/1982 | Liedholm | |
| 4,395,009 A | 7/1983 | Bormke | |
| (Continued) | | | |

FOREIGN PATENT DOCUMENTS

| CN | 111697499 A * | 9/2020 | ............... H02G 3/32 |
|---|---|---|---|
| DE | 102013216561 B4 * | 6/2018 | ............... H01R 4/42 |

OTHER PUBLICATIONS

PCT/US2018/037594 International Search Report and Written Opinion dated Aug. 30, 2018 (13 pages).
(Continued)

*Primary Examiner* — Matthew R McMahon
(74) *Attorney, Agent, or Firm* — Michael Best & Friedrich LLP

(57) ABSTRACT

A clamp assembly includes a body having a first side and a second side. The body includes a first channel configured to receive a flat wire, a second channel configured to receive a round wire, a first projection extending from the first side of the body, and a second projection extending from the second side of the body. The clamp assembly further includes a first clamp member coupled to the first projection and a second clamp member coupled to the second projection.

24 Claims, 15 Drawing Sheets

(56) References Cited

U.S. PATENT DOCUMENTS

| | | | |
|---|---|---|---|
| 4,457,577 A | 7/1984 | Browne et al. | |
| 4,863,390 A * | 9/1989 | Cera | H01R 4/38 |
| | | | 439/100 |
| 6,889,944 B2 * | 5/2005 | Brandzel | F16L 3/222 |
| | | | 248/65 |
| 6,986,673 B2 * | 1/2006 | de la Borbolla | H01R 4/44 |
| | | | 439/100 |
| 7,780,461 B1 | 8/2010 | Vernica | |
| 8,177,563 B1 | 5/2012 | Vernica | |
| 8,864,502 B2 * | 10/2014 | Dinh | H01R 24/30 |
| | | | 439/97 |
| 8,864,504 B1 * | 10/2014 | Gretz | H01R 4/60 |
| | | | 439/100 |
| 10,677,377 B2 * | 6/2020 | Sheppard | F16L 3/1075 |
| 2021/0088157 A1 * | 3/2021 | Itokazu | F16L 3/1207 |

OTHER PUBLICATIONS

"230 kV Aluminum Bolted Cable to Flat Bar Ground Clamps" (AFL) May 5, 2012, <URL=https://web.archive.org/web/20120505201305/https://www.aflglobal.com/Products/Conductor-Accessories/Substation-Accessories/230kV-or-Less-Aluminum-Bolted/Bolted-Ground-Clamps/230kv-Aluminum-Bolted-Cable-to-Flat-Bar-Ground-Cla.aspx).

* cited by examiner

US 11,536,304 B2

CLAMP ASSEMBLY

CROSS-REFERENCE TO RELATED APPLICATION

This application claims the benefit of prior-filed U.S. Provisional Patent Application No. 62/519,546, filed Jun. 14, 2017, the entire contents of which are incorporated by reference herein.

BACKGROUND

The present application relates to a clamp assembly for wires or cables.

SUMMARY

In one embodiment, a clamp assembly includes a body, a first clamp member, and a second clamp member. The body has a first side and a second side, and the body includes a first channel, a second channel, a first projection extending from the first side of the body, and a second projection extending from the second side of the body. The first channel is configured to receive a first conducting member, and the second channel is configured to receive a second conducting member. The first clamp member is coupled to the first projection, and the second clamp member is coupled to the second projection.

In another embodiment, a clamp assembly includes a body, a first clamp member and a second clamp member. The body has a first side and a second side, and the body includes a first channel, a second channel, a first pair of projections extending from the first side of the body, and a second pair of projections extending from the second side of the body. The first channel is configured to receive a first conducting member, and the second channel is configured to receive a second conducting member. The first clamp member is coupled to at least one of the projections in the first pair of projections, and the second clamp member is coupled to at least one of the projections in the second pair of projections.

Other aspects of the clamp assembly will become apparent by consideration of the detailed description and accompanying drawings.

DETAILED DESCRIPTION

Figure 1:
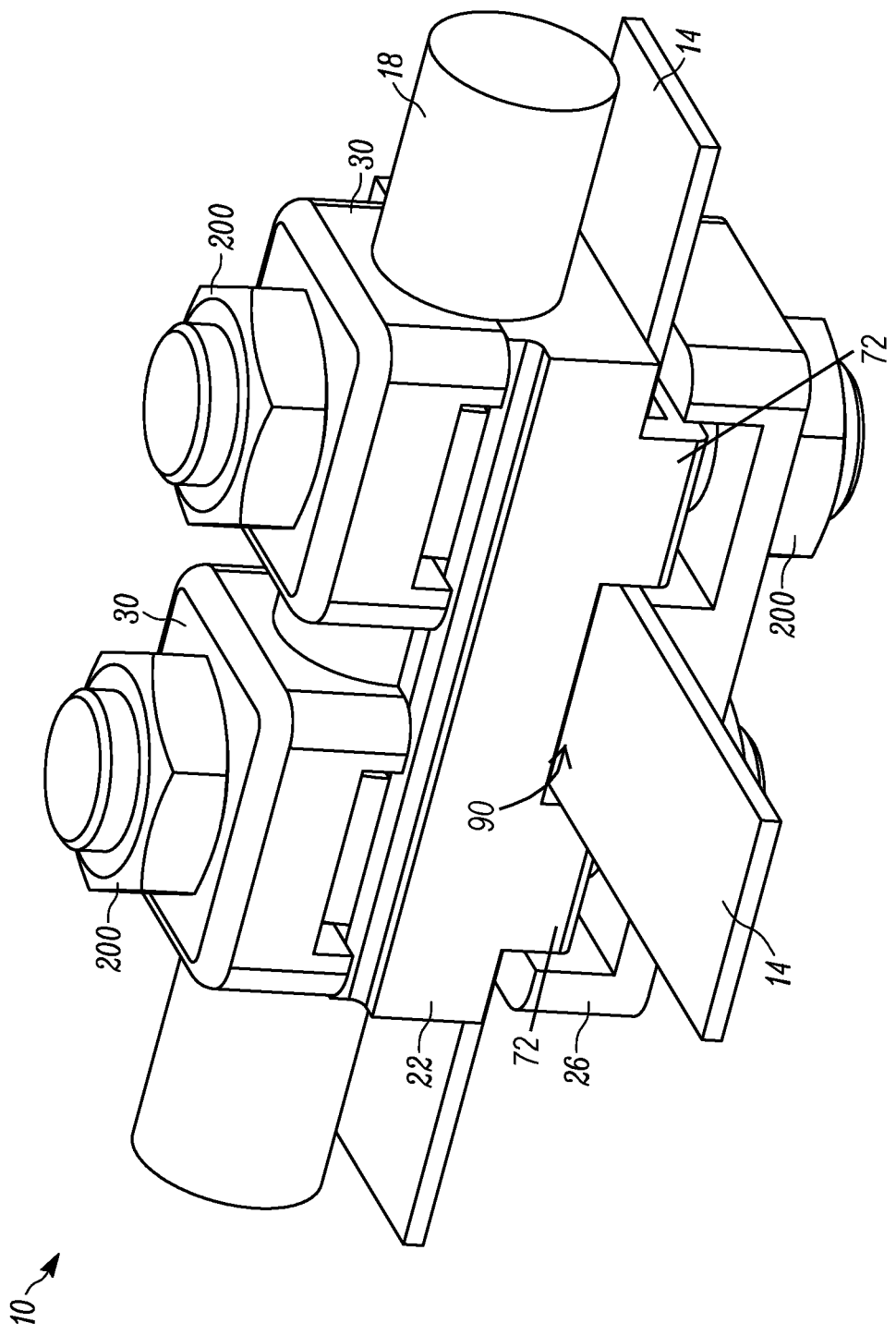
FIG. 1 is a perspective view of a clamp assembly according to one embodiment.

Before any embodiments are explained in detail, it is to be understood that the disclosure is not limited in its application to the details of construction and the arrangement of components set forth in the following description or illustrated in the following drawings. The disclosure is capable of other embodiments and of being practiced or of being carried out in various ways. Also, it is to be understood that the phraseology and terminology used herein is for the purpose of description and should not be regarded as limiting. Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof. Unless specified or limited otherwise, the terms "mounted," "connected," "supported," and "coupled" and variations thereof are used broadly and encompass both direct and indirect mountings, connections, supports, and couplings.

FIGS. 1-19 show a clamp assembly 10 according to one embodiment. The clamp assembly 10 couples one or more grounding wires or cables 14 (including, for example, one or more wires having a substantially rectangular cross-section) to a conductive wire or cable 18 (including, for example, a wire having a substantially circular cross-section or another shape). The clamp assembly 10 includes a main member or first coupling member 22, a second coupling member 26 (i.e., a first clamp member), and one or more third coupling members 30 (i.e., one or more second clamp members).

FIGS. 10-11 and 14-16 show the first coupling member 22 of the clamp assembly 10 in greater detail. The first coupling member 10 includes a body 40 that has a longitudinal axis A (FIG. 10), a first channel 44 that is substantially circular (FIGS. 11, 14, and 16), and a second channel 48 (FIGS. 11, 16) that is substantially rectangular and parallel to the first channel 44. The first channel 44 and the second channel 48 in the illustrated embodiment are parallel to the longitudinal axis A. The first channel 44 has a plurality of grooves 52 (FIG. 14) that extend along the longitudinal axis A.

Figure 10:
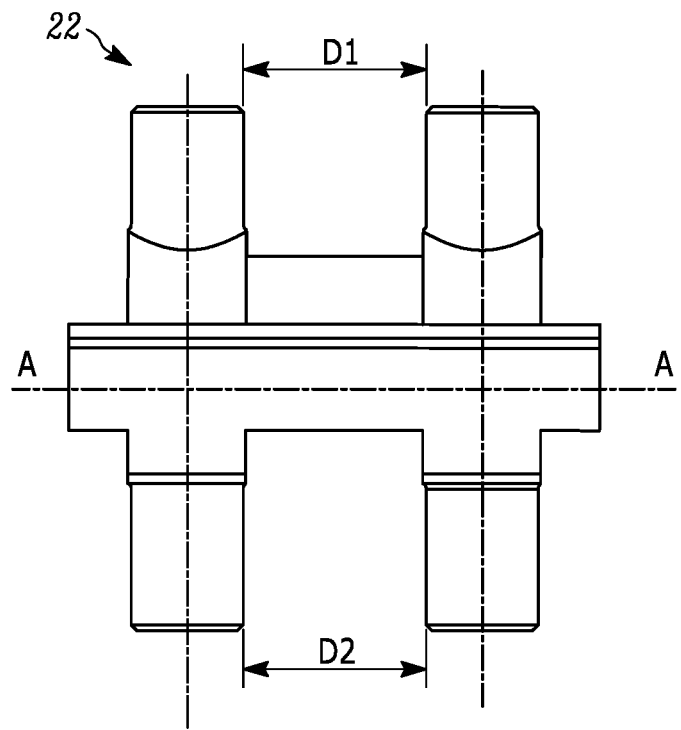
FIG. 10 is side view of a body of the clamp assembly of FIG. 1.
Figure 11:
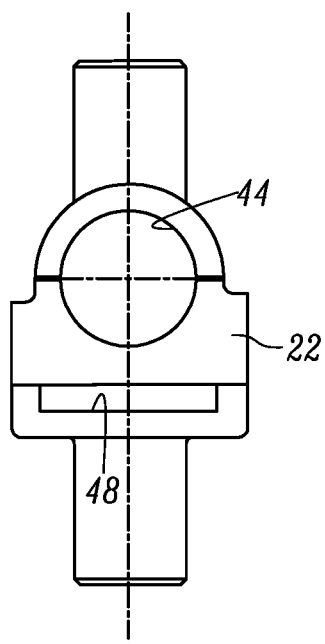
FIG. 11 is another side view of the body of the clamp assembly of FIG. 1.

The body 40 further includes a plurality of projections 60. Two of the projections 60' include a semi-circular portion 64 and a cylindrical portion 68. The first channel 44 is formed by the body 40 and semi-circular portions 64 of the projections 60'. The projections 60' are spaced apart from one another by a distance D1 (FIG. 10). Two projections 60" include a rectangular portion 72 and a cylindrical portion 76.

The second channel 48 is formed by the body 40 and the rectangular portions 72 of the projections 60". The projections 60" are spaced apart from one another by a distance D2 (FIG. 10). In the illustrated embodiment, D1 is approximately equal to D2. Accordingly, one of the projections 60' is aligned with (i.e., coaxial with) one of the projections 60". The projections 60' extend from a first side 80 of the body 40 and the projections 60" extend from a second, opposite side 84 of the body 40. The projections 60 are substantially perpendicular to the first and the second channels 44, 48.

Figure 2:
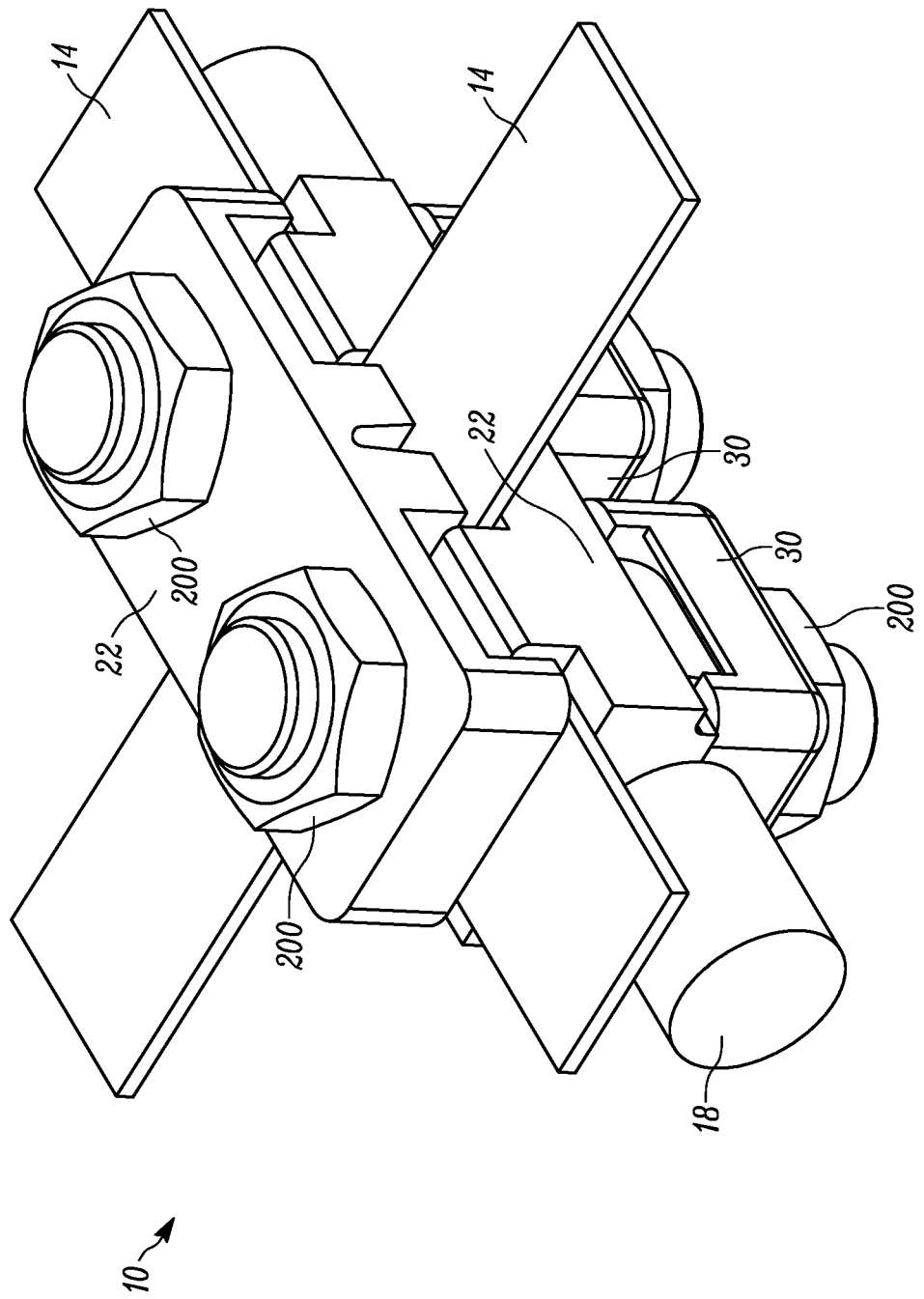
FIG. 2 is another perspective view of the clamp assembly of FIG. 1.
Figure 3:
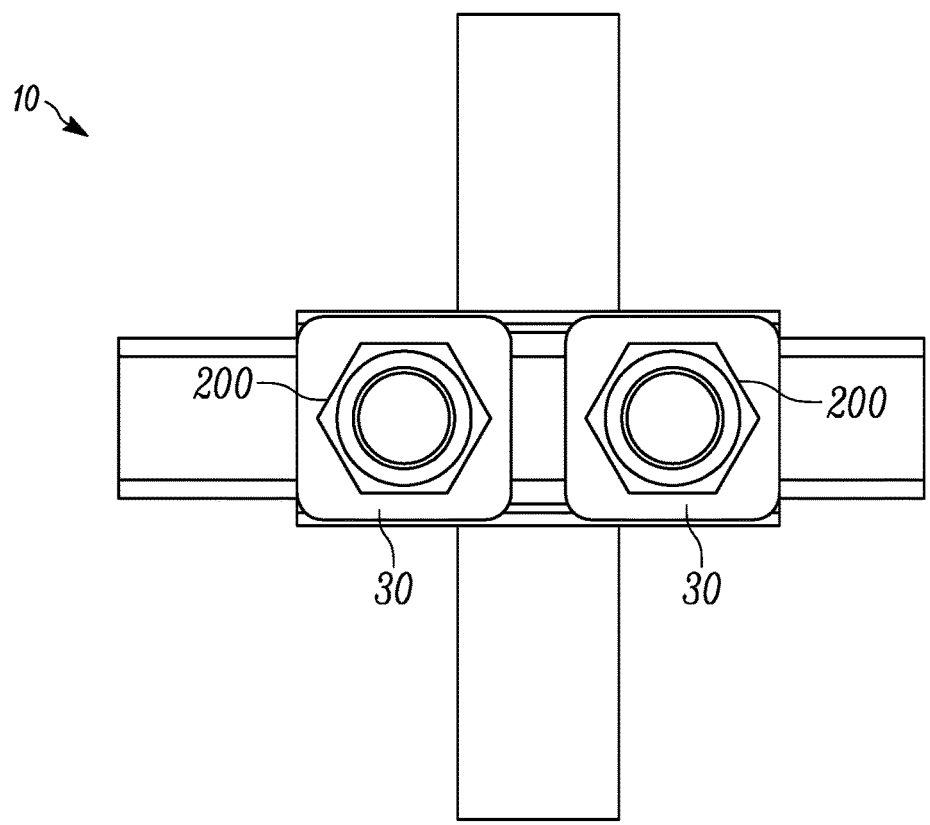
FIG. 3 is side view of the clamp assembly of FIG. 1.
Figure 4:
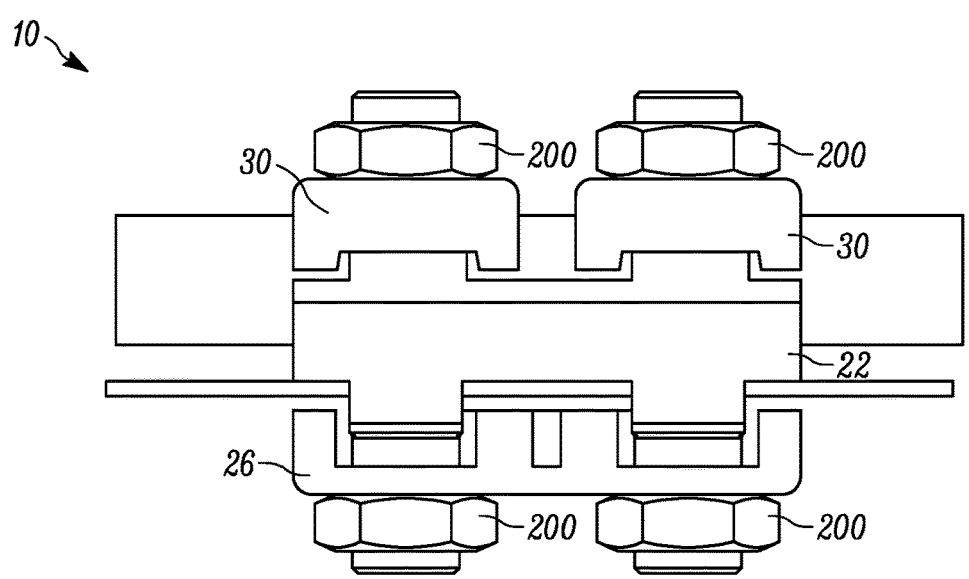
FIG. 4 is another side view of the clamp assembly of FIG. 1.
Figure 5:
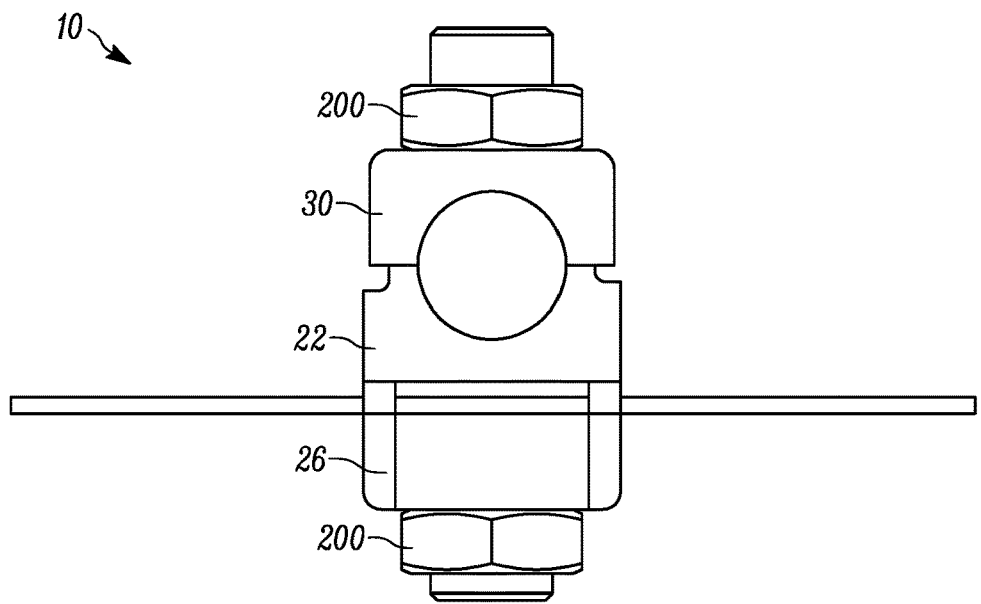
FIG. 5 is another side view of the clamp assembly of FIG. 1.
Figure 6:
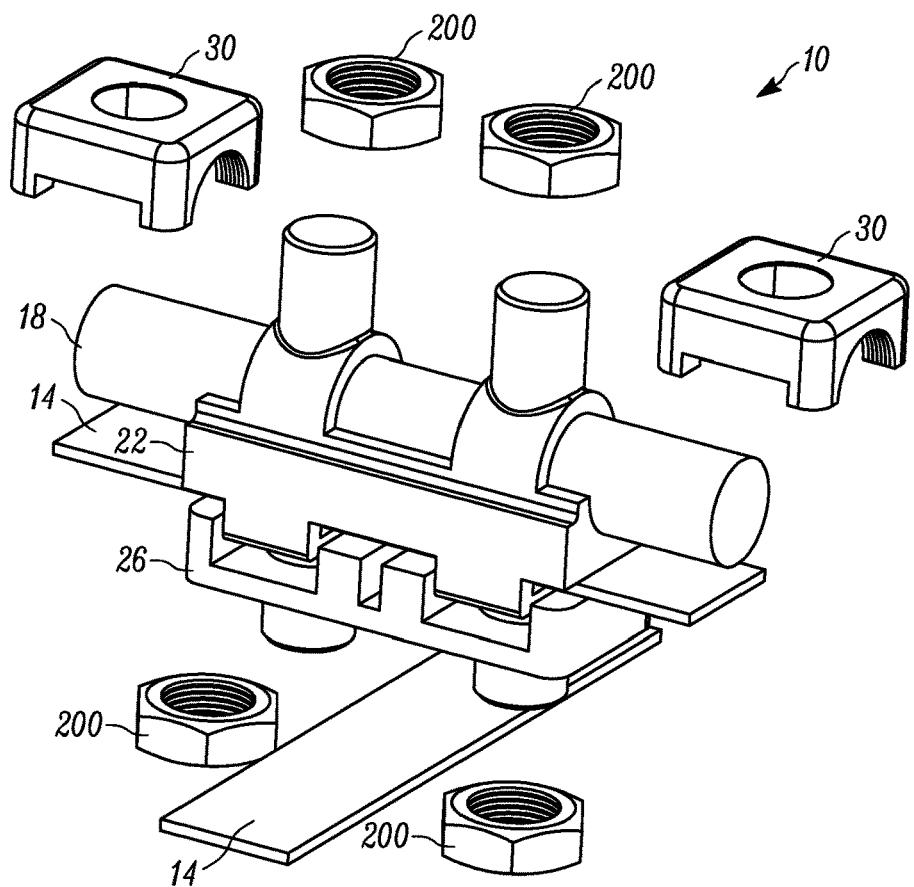
FIG. 6 is an exploded view of the clamp assembly of FIG. 1.
Figure 7:
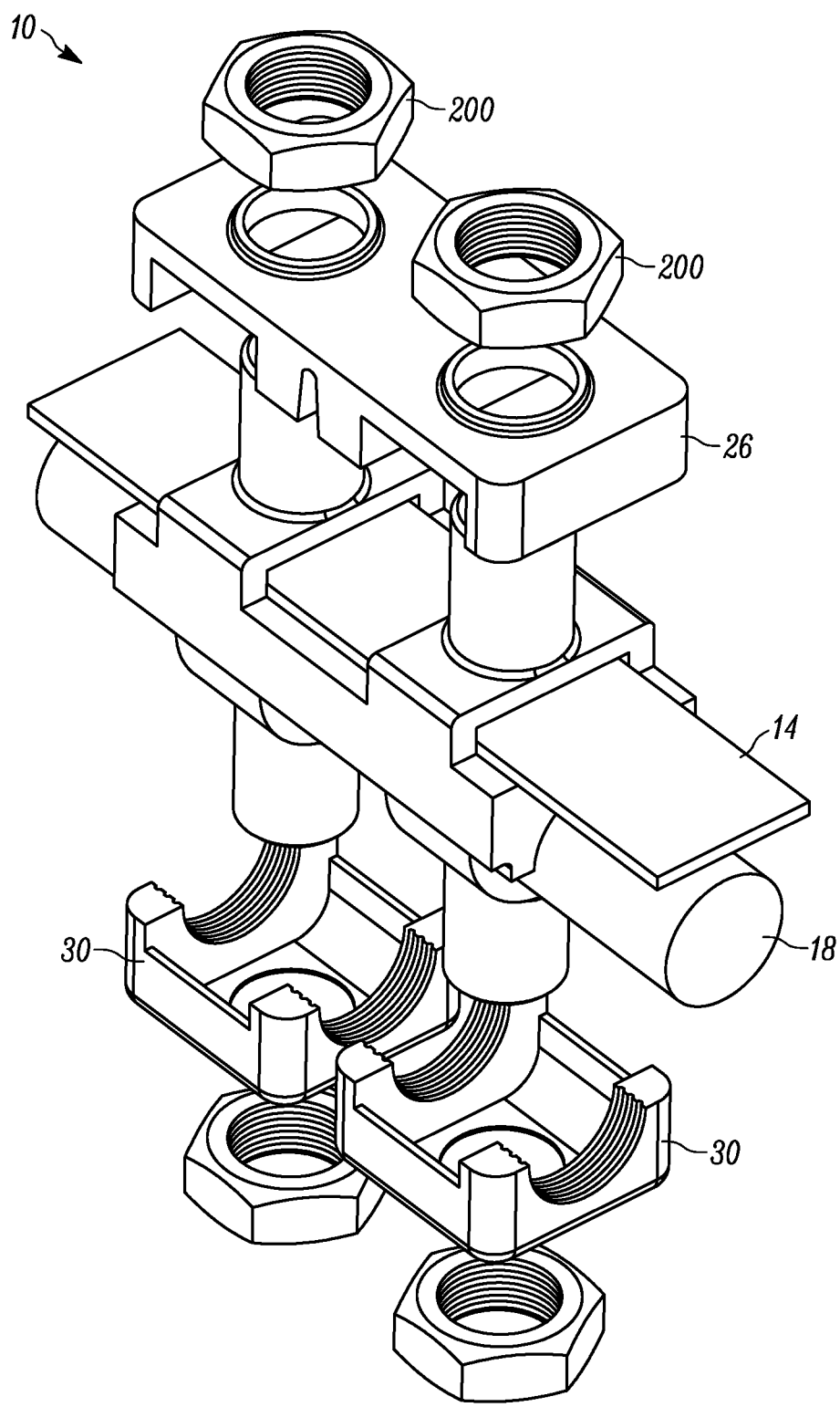
FIG. 7 is another exploded view of the clamp assembly of FIG. 1.
Figure 9:
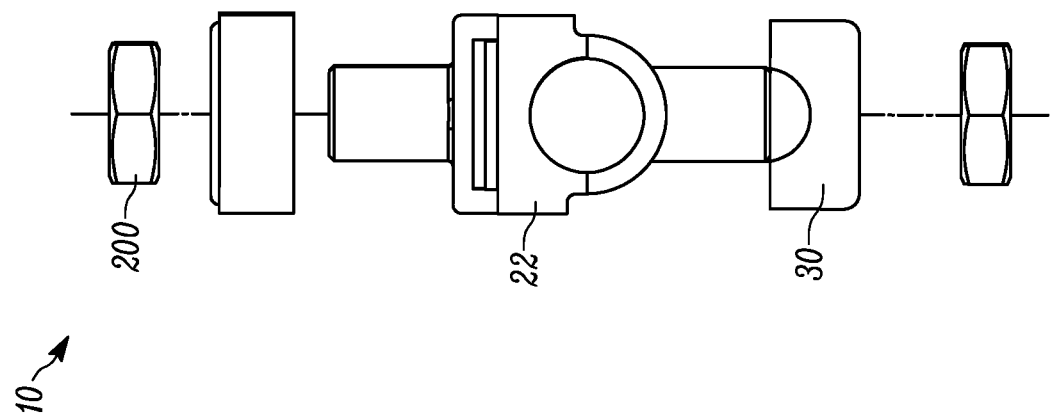
FIG. 9 is another exploded view of the clamp assembly of FIG. 1.
Figure 8:
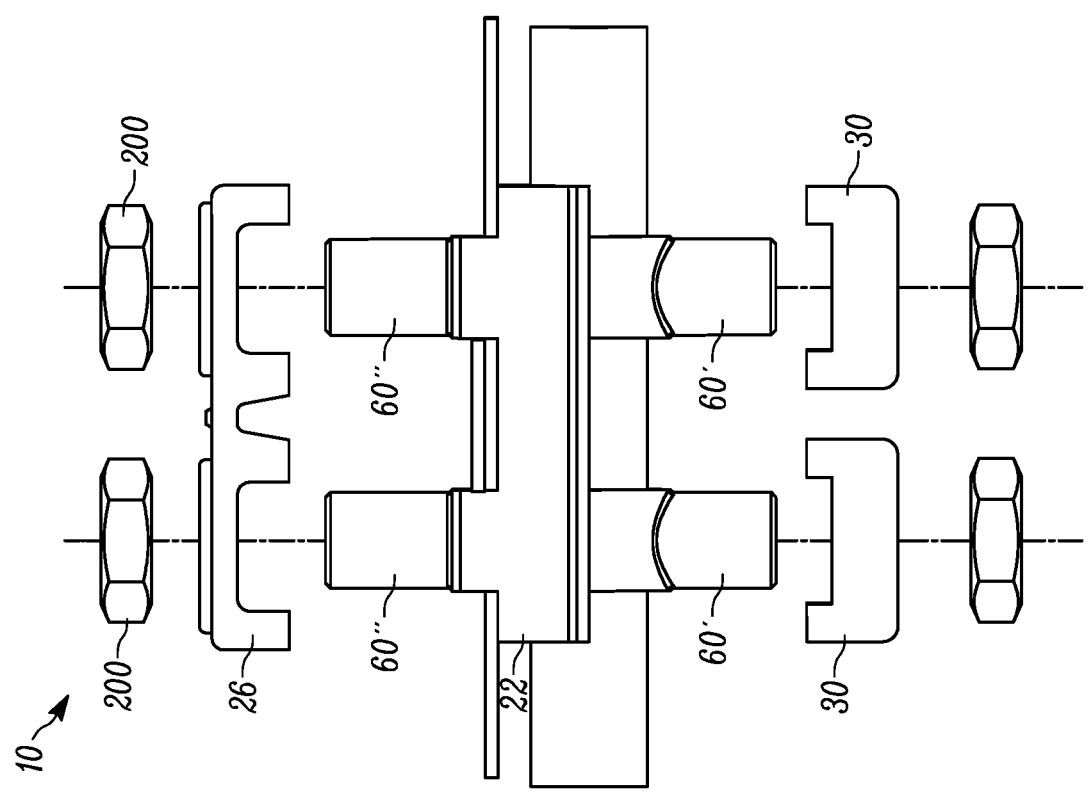
FIG. 8 is another exploded view of the clamp assembly of FIG. 1.

In the illustrated embodiment, the first coupling member 22 is configured to receive the round wire 18 having a round cross-section in the first channel 44 and configured to receive the flat wire 14 having a rectangular cross-section in the second channel 48. As shown in FIGS. 1 and 2, another flat wire 14 having a rectangular cross-section can be positioned in a space 90 (FIGS. 1 and 14) between the rectangular portions 72 of the projections 60". Accordingly, the first coupling member 22 is configured to receive flat wires 14 in two orientations.

Figure 12:
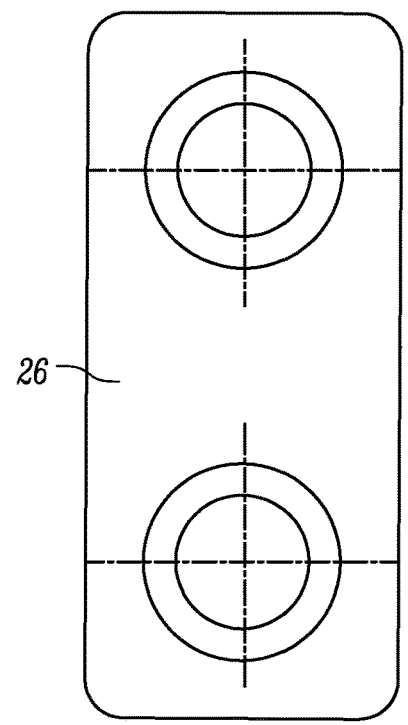
FIG. 12 is a side view of a first coupling member of the clamp assembly of FIG. 1.
Figure 13:
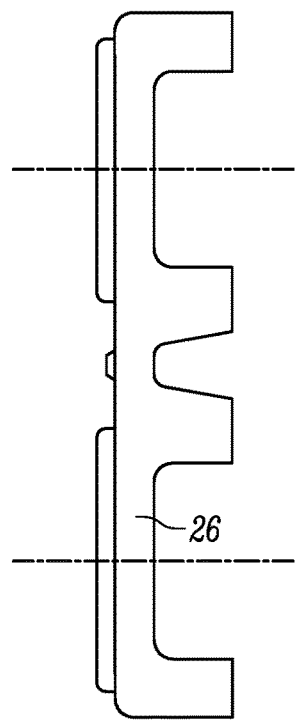
FIG. 13 is another side view of the first coupling member of the clamp assembly of FIG. 1.
Figure 14:
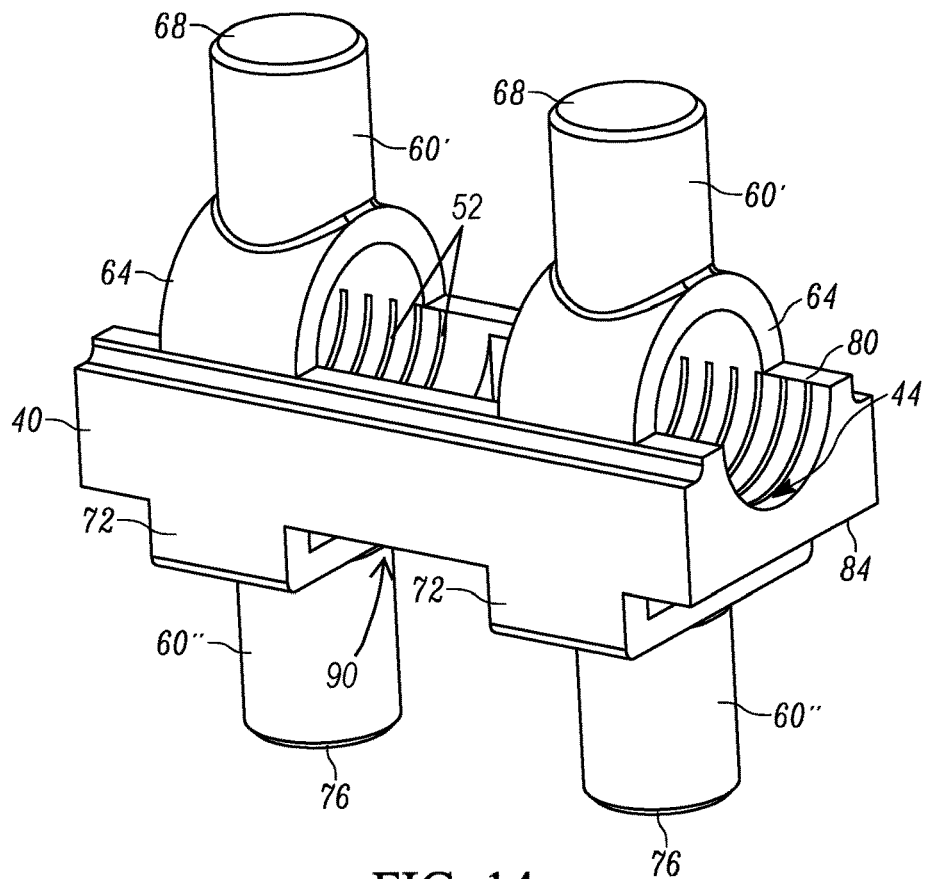
FIG. 14 is perspective view of the body of the clamp assembly of FIG. 1.
Figure 15:
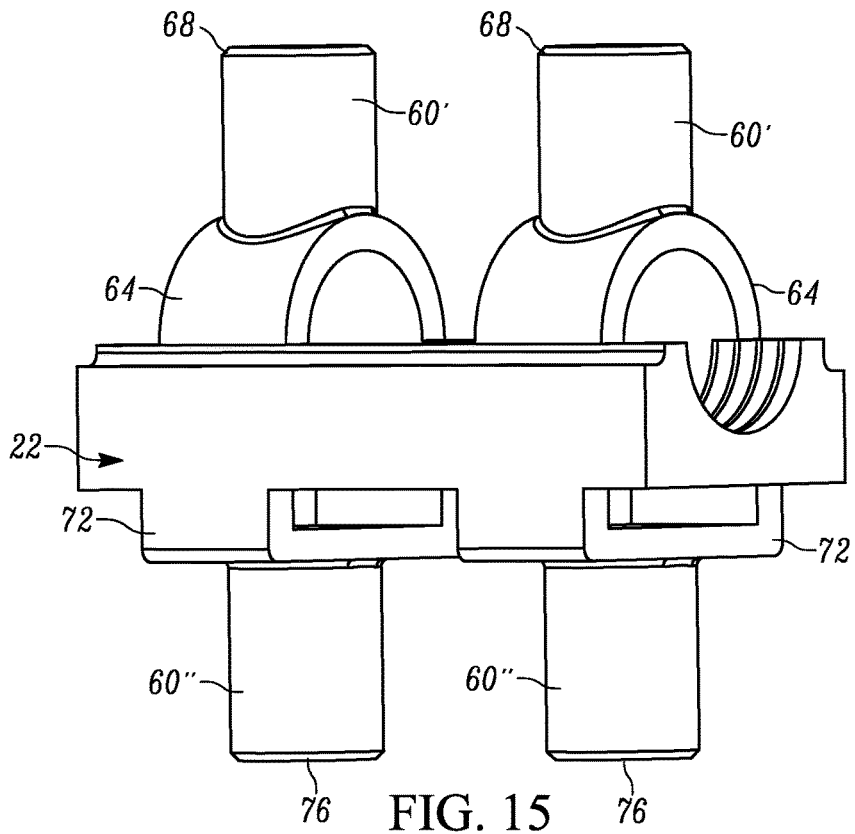
FIG. 15 is another perspective view of the body of the clamp assembly of FIG. 1.
Figure 16:
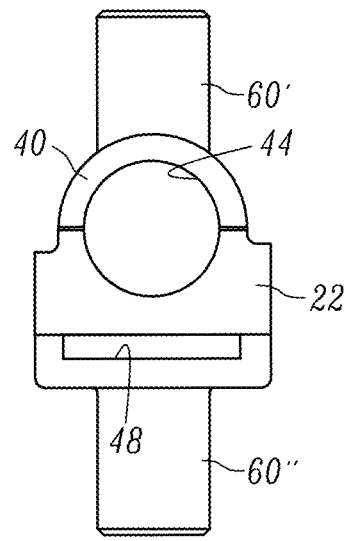
FIG. 16 is another side view of the body of the clamp assembly of FIG. 1.
Figure 17:
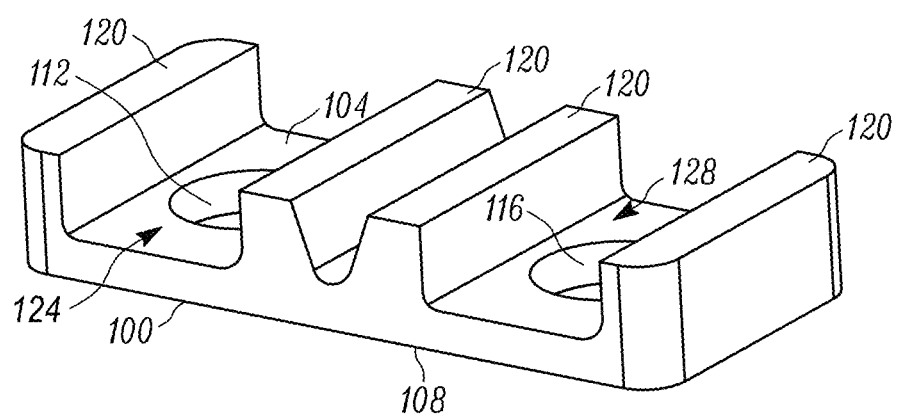
FIG. 17 is a perspective view of the first coupling member of the clamp assembly of FIG. 1.

Referring now to FIGS. 12-13 and 17, the second coupling member 26 includes a body 100 having a first side 104 and a second side 108. The body 100 includes a first aperture 112 and a second aperture 116 extending therethrough and a plurality of projections 120 extending from the first side 104 of the body 100. Two of the projections 120 create a first recess 124 (FIG. 17) and two of the projections 120 create a second recess 128. The body 100 of the second coupling member 26 is configured to receive the rectangular portions 72 of the projections 60". In particular, the first recess 124 is configured to receive the rectangular portion 72 of one of the projection 60" and the second recess 128 is configured to receive the rectangular portion 72 of one of the projections 60". Further, the aperture 112 receives the cylindrical portion 76 of one of the projections 60" and the aperture 116 receives the cylindrical portion 76 of the other projection 60". The projections 120 of the second coupling member 26 clamp the first and the second flat wires 14 between the first coupling member 22 and the second coupling member 26.

Figure 18:
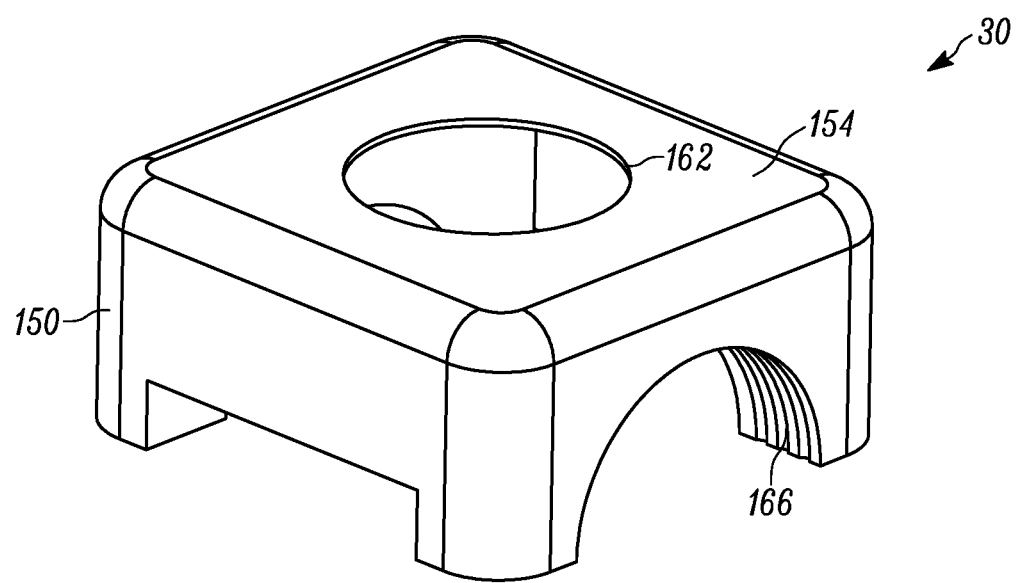
FIG. 18 is a perspective view of a second coupling member of the clamp assembly of FIG. 1.
Figure 19:
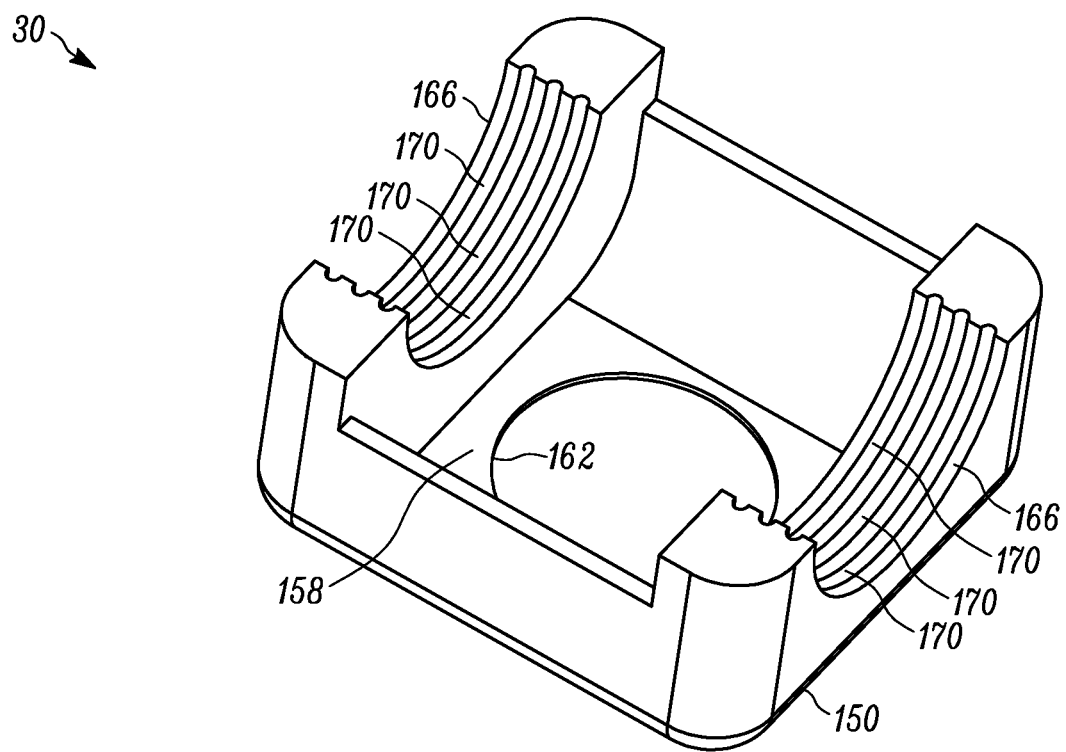
FIG. 19 is another perspective view of the second coupling member of the clamp assembly of FIG. 1.
Figure 20:
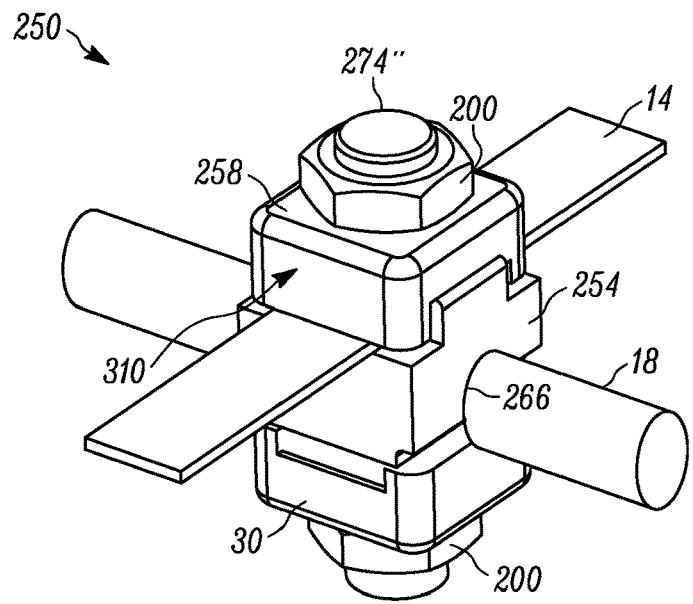
FIG. 20 is a perspective view of a clamp assembly according to another embodiment.
Figure 21:
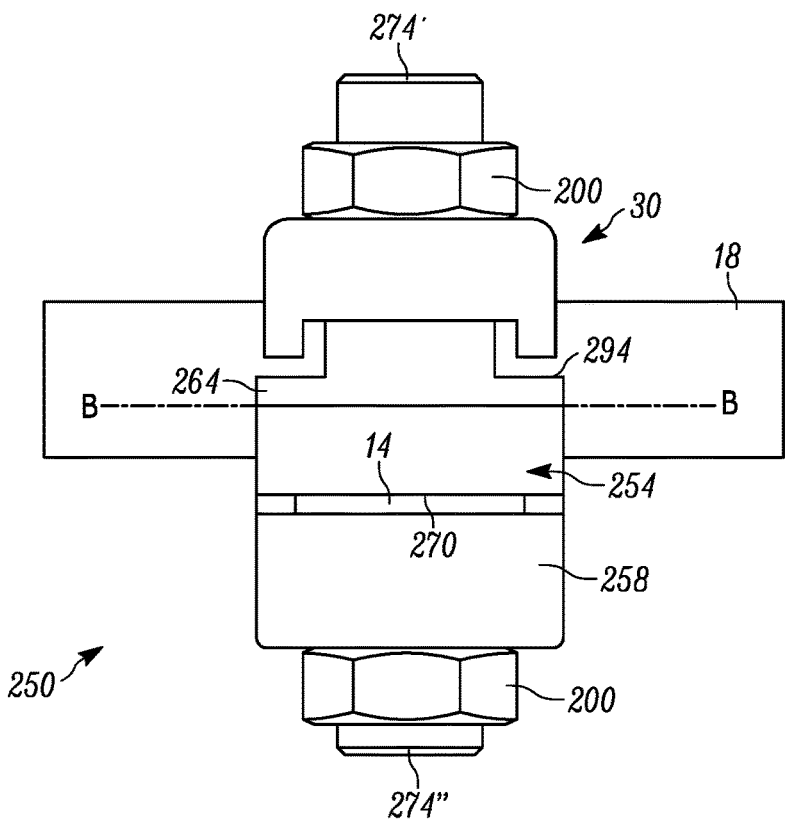
FIG. 21 is a side view of the clamp assembly of FIG. 20.
Figure 22:
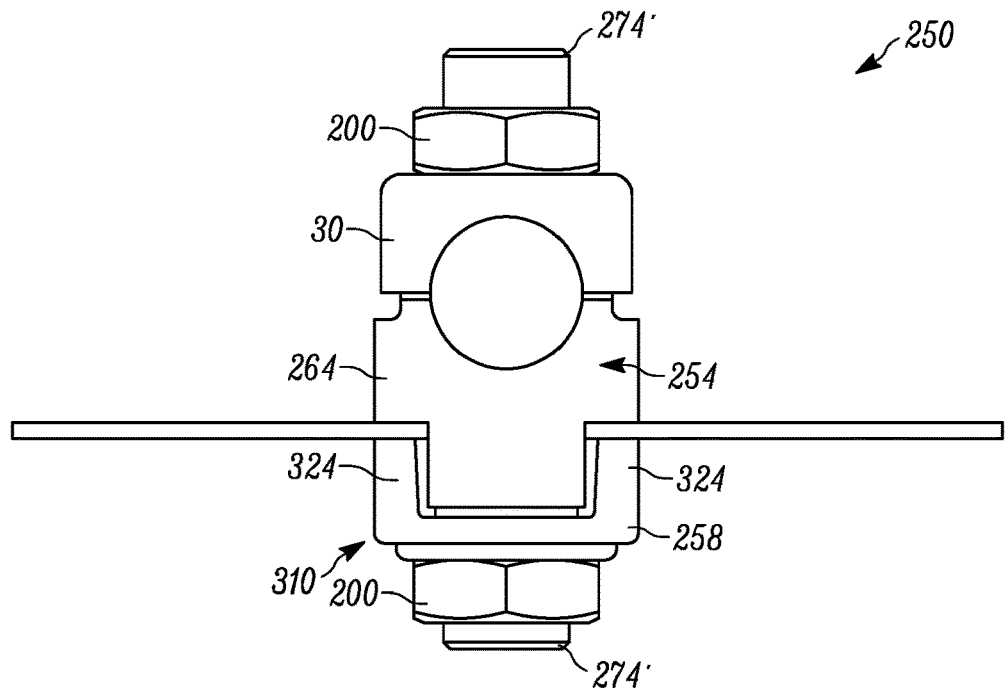
FIG. 22 is another side view of the clamp assembly of FIG. 20.
Figure 23:
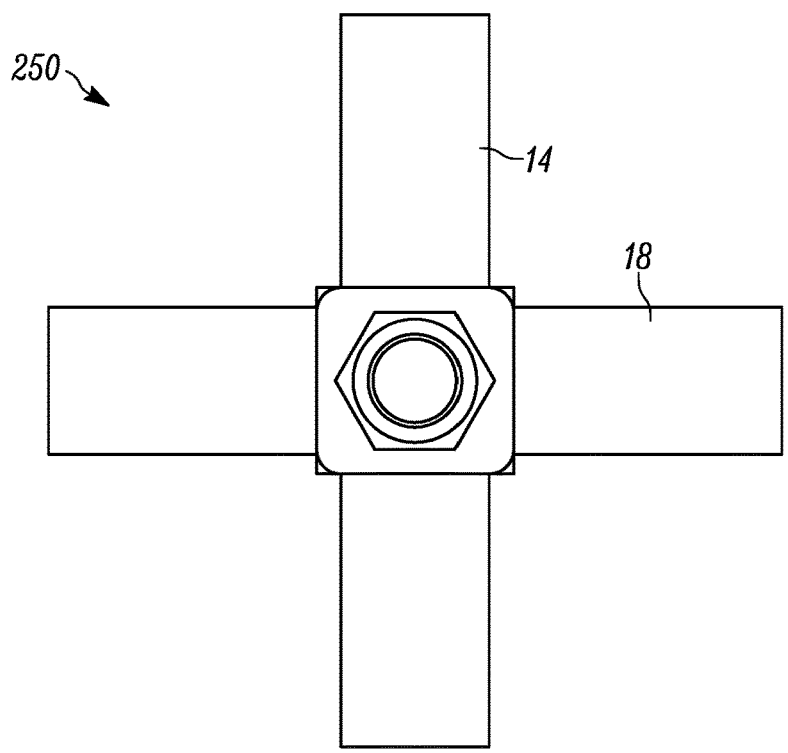
FIG. 23 is a top view of the clamp assembly of FIG. 20.
Figure 24:
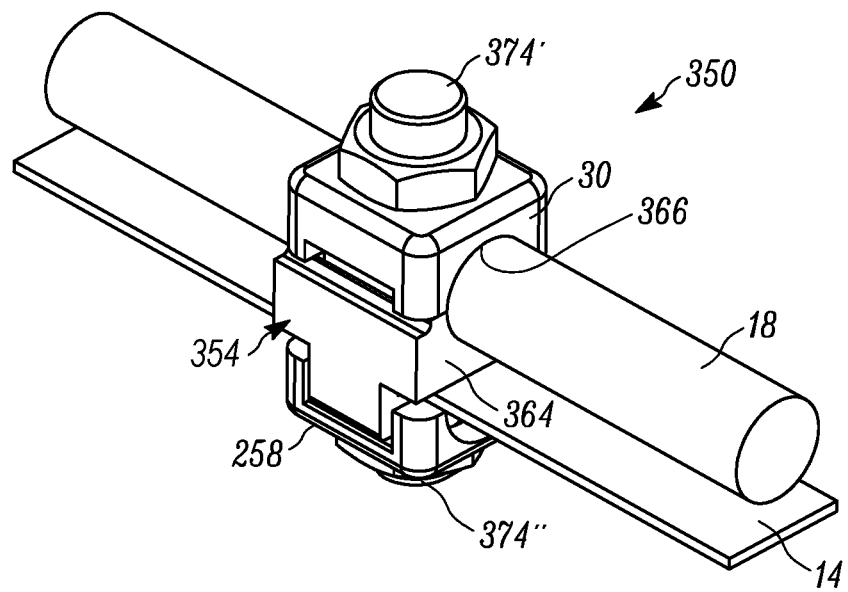
FIG. 24 is a perspective view of a clamp assembly according to another embodiment.
Figure 25:
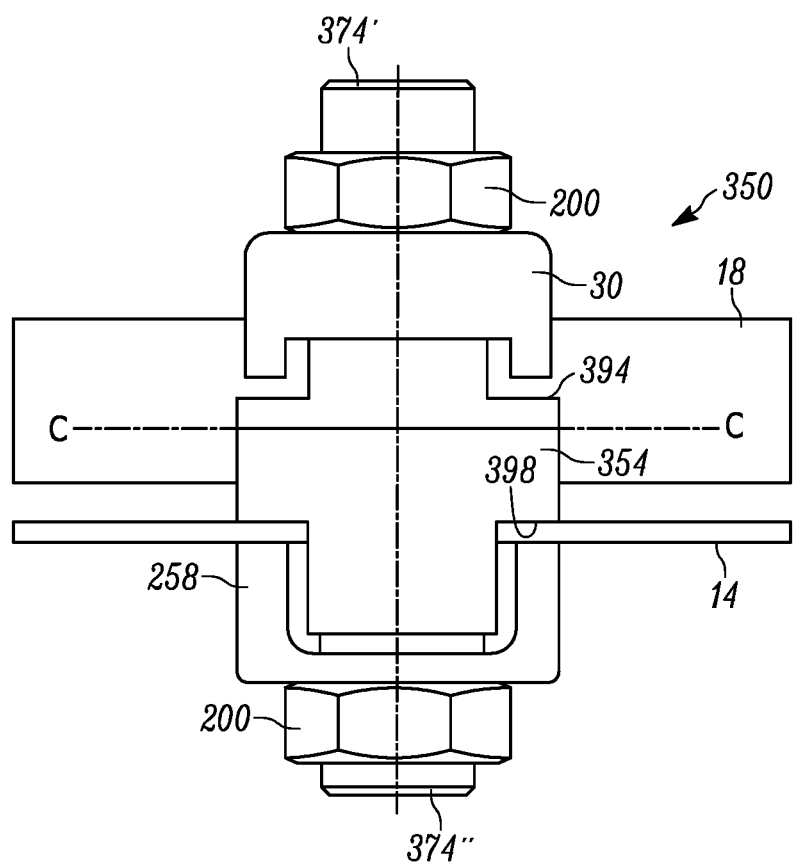
FIG. 25 is a side view of the clamp assembly of FIG. 24.
Figure 26:
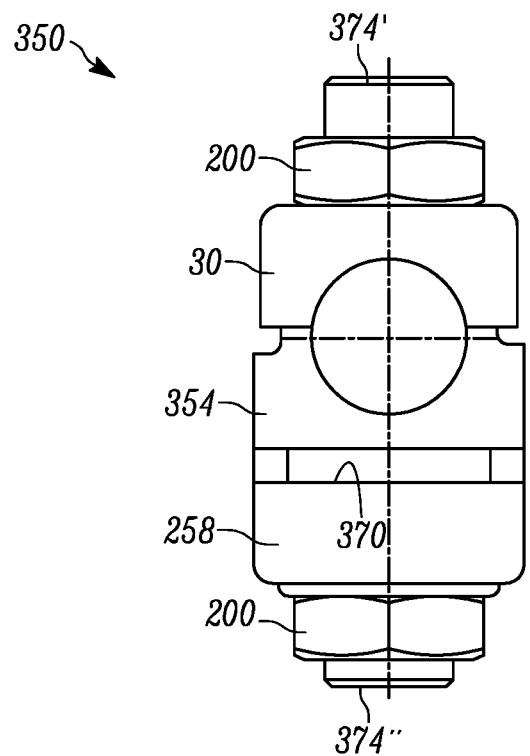
FIG. 26 is another side view of the clamp assembly of FIG. 24.
Figure 27:
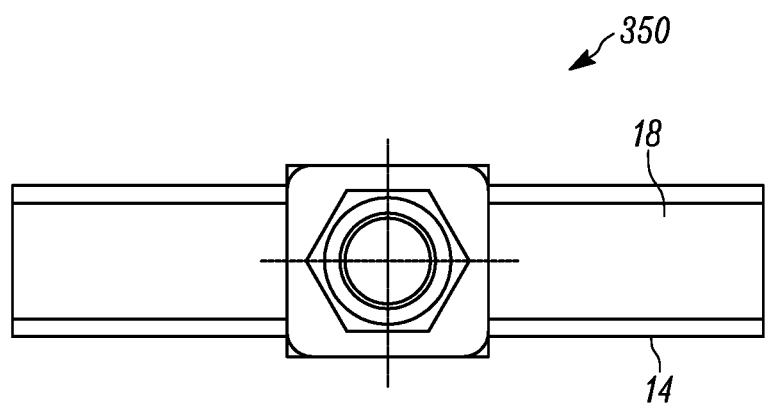
FIG. 27 is a top view of the clamp assembly of FIG. 24.

FIGS. 18 and 19 show the third coupling member 30. In the illustrated embodiment the clamp assembly 10 includes two of the third coupling members 30, although only one is shown in FIGS. 18 and 19. Each of the third coupling members 30 includes a body 150 including a first side 154 and a second side 158. An aperture 162 extends through the body 150. The body 150 of the third coupling member 30 also includes first and second recesses 166 that are substantially semi-circular and include a plurality of grooves 170. The body 150 of each of the third coupling member 30 is configured to receive the semi-circular portion 64 of one projections 60' and the aperture 162 is configured to receive one of the cylindrical portions 68 of the projections 60'. The first and second recesses 166 accommodate a perimeter of the round wire 18.

As shown in FIGS. 1-9, fasteners 200 can secure the second coupling member 26 and the one or more third coupling members 30 to the first coupling member 22 of the clamp assembly 10. In the illustrated embodiment, the fasteners 200 are nuts that have threads that are matingly coupled to the threads on the projections 60', 60". Accordingly, the fasteners 200 are tightened onto the ends of the cylindrical portions 68, 76 of the respective projections 60', 60".

To assemble, the one or more flat wires 14 are positioned in the first channel 44 and the round wire 18 is positioned in the second channel 48. The second coupling member 26 is positioned on the first coupling member 22 such that the rectangular portions 72 of the projections 60" are positioned in the first and second recesses 124, 128 and the cylindrical portions 76 of the projections 60" extend through the apertures 112, 116. Then, two third coupling members 30 are positioned on the first coupling member 22. The semi-cylindrical portion 64 of each of the projections 60' is received in one of the third coupling members 30 and the cylindrical portion 68 of the projection 60' extends through the aperture 162 of one of the third coupling members 30. Then a fastener 200 is secured to each of the cylindrical portions 68, 76 of the projections 60', 60".

FIGS. 20-23 illustrate a clamp assembly 250 according to another embodiment. The clamp assembly couples a flat or grounding wire or cable 14 to a substantially round or conductive wire or cable 18. The clamp assembly includes a first coupling member 254, a second coupling member 258, and a third coupling member 30.

The first coupling member 254 includes a body 264 that has a longitudinal axis B, a first channel 266 that is substantially circular, and a second channel 270 that is substantially rectangular and perpendicular to the first channel 266. The body 264 further includes a plurality of projections 274. One projection 274' includes a semi-circular portion and a cylindrical portion, which are similar to that of projection 60' described above. The first channel 266 is formed by the body 264 and semi-circular portion of the projection 274'. Another projection 274" includes a rectangular portion and a cylindrical portion, which are similar to that of projection 60" described above. The second channel 270 is formed by the body 264 and the rectangular portion of the second projection 274". The projection 274' is aligned with (i.e., coaxial with) the projection 274". The projection 274' extends from a first side 294 of the body 264 and the projection 274" extends from a second, opposite side 298 of the body 264. The projections 274', 274" are substantially perpendicular to the first and the second channels 266, 270. The first and second channels 266, 270 are perpendicular to one another. The first coupling member 254 is configured to receive wire 18 having a round cross-section in the first channel 266 and configured to receive the wire 14 having a rectangular cross-section in the second channel 270.

The second coupling member 258 includes a body 310 having a first side and a second side. The body 310 includes an aperture extending therethrough and a plurality of projections 324 extending from the first side 314 of the body 310. The projections 324 create a recess (not shown) but similar to recesses 124, 128 described above. The body 310 of the second coupling member 258 is configured to receive the rectangular portion of the projection 274". In particular, the recess is configured to receive the rectangular portion of the projection 274". The aperture is configured to receive the cylindrical portion of the projection 274" of the first coupling member 254 of the clamp assembly 250. The projections 324 clamp the flat wire 14 between the first coupling member 254 and the second coupling member 258.

In the illustrated embodiment the clamp assembly of FIGS. 20-23 includes one third coupling member 30 that is substantially the same as the third coupling member 30 described above with respect to FIGS. 1-19, and therefore, for the sake of brevity will not be re-described.

FIGS. 20-23 show that fasteners 200 secure the second coupling member 258 and the third coupling member 30 to the first coupling member 258 of the clamp assembly 250.

To assemble, the flat wire 14 is positioned in the second channel 270 and the round wire 18 is positioned in the first channel 266. The second coupling member 258 is positioned on the first coupling member 254 such that the rectangular portion of projection 274" is positioned in the first recess and the cylindrical portion 290 of the projection 274" extends through the aperture. Then the third coupling member 30 is positioned on the first coupling member 254. The semi-cylindrical portion of the projection 274' is received in the third coupling member 30 and the cylindrical portion of the first projection 274' extends through the aperture 162 of the third coupling member 30. Then a fastener 200 is secured to each of the cylindrical portions of the projections 274', 274".

FIGS. 24-27 illustrate a clamp assembly 350 according to another embodiment. The clamp assembly 350 couples a flat or grounding wire or cable 14 to a substantially round or conductive wire or cable 18. The clamp assembly 350 includes a first coupling member 354, a second coupling member 258, and a third coupling member 30.

The first coupling member 354 includes a body 364 that has a longitudinal axis C, a first channel 366 that is substantially circular, and a second channel 370 that is substantially rectangular and parallel to the first channel 366. The body 364 further includes a plurality of projections 374. One projection 374' includes a semi-circular portion and a cylindrical portion, which are similar to that of projection 60' described above. The first channel 366 is formed by the body 364 and semi-circular portion of the projection 374'. Another projection 374" includes a rectangular portion and a cylindrical portion, which are similar to that of projection 60" described above. The second channel 370 is formed by the body 364 and the rectangular portion of the projection 374". The projection 374' is aligned with (i.e., coaxial with) the projection 374". The projection 374' extends from a first side 394 of the body 364 and the projection 364" extends from a second, opposite side 398 of the body 364. The projections 374', 374" are substantially perpendicular to the first and the second channels 366, 370. The first coupling member 354 is configured to receive a wire 18 having a round cross-section in the first channel 360 and configured to receive a wire 14 having a rectangular cross-section in the second channel 370.

The illustrated embodiment the clamp assembly of FIGS. 24-27 includes one second coupling member 258 that is substantially the same as the second coupling member 258 described above with respect to FIGS. 20-23 and a third coupling member 30 that is substantially the same as the third coupling member 30 described above with respect to FIGS. 1-19, and therefore, for the sake of brevity will not be re-described.

FIGS. 24-27 show that fasteners 200 secure the second coupling member 258 and the one or more third coupling members 30 to the first coupling member 354 of the clamp assembly 350. In the illustrated embodiment, the fasteners 200 are nuts that are tightened onto the ends of the cylindrical portions of the respective projections 374', 374".

To assemble, the flat wire 14 is positioned in the second channel 370 and the round wire 18 is positioned in the first channel 366. The second coupling member 258 is positioned on the first coupling member 354 such that the rectangular portion of projection 374" is positioned in the first recess and the cylindrical portion of the projection 374" extends through the aperture. Then the third coupling member 30 is positioned on the first coupling member 354. The semi-cylindrical portion of each projection 374' is received in the third coupling member 30 and the cylindrical portion of the projection 374' extends through the aperture of the third coupling member 30. Then a fastener 200 is secured to each of the cylindrical portions of the first and second projections 374', 374".

The first coupling members 22, 254, 354, the second coupling members 26, 258, and one or more third coupling members 30 of the clamp assemblies 10, 250, 350 are constructed of copper alloy, brass, or aluminum, although any material that is suitable may be used in other or additional embodiments. In the illustrated embodiment, the clamp assembly is configured to receive a 7/16"-3/4" flat wire and a 3/0-4/0 STR round wire. In other or additional embodiments, the clamp assembly can be configured to receive flat and round wires having other dimensions.

The embodiments described above and illustrated in the figures are presented by way of example only and are not intended as a limitation upon the concepts and principles presented herein. As such, it will be appreciated that variations and modifications exist within the scope and spirit of one or more independent aspects as described.

What is claimed is:

1. A clamp assembly comprising:
a body having a first side and a second side, the body including a first channel, a second channel, a first projection extending from the first side of the body, and a second projection extending from the second side of the body, the first channel configured to receive a first conducting member, the second channel configured to receive a second conducting member, the first projection defining at least a portion of the first channel, the second projection defining at least a portion of the second channel;
a first clamp member coupled to the first projection; and
a second clamp member coupled to the second projection, wherein the first projection includes a rectangular portion and a cylindrical portion and the first clamp member includes a recess and an aperture, the recess receiving the rectangular portion and the cylindrical portion extending through the aperture.

2. The clamp assembly of claim 1, wherein the first channel extends parallel to the second channel.

3. The clamp assembly of claim 1, wherein the first channel extends perpendicular to the second channel.

4. The clamp assembly of claim 1, wherein the second projection includes a semi-circular portion and a cylindrical portion and the second clamp member includes a recess and an aperture, the recess receiving the semi-circular portion and the cylindrical portion extending through the aperture.

5. The clamp assembly of claim 1 further comprising a first fastener that secures the first clamp member to the body and a second fastener that secures the second clamp member to the body.

6. The clamp assembly of claim 1, wherein the first conducting member has a rectangular cross-section and the second conducting member has a round cross-section.

7. The clamp assembly of claim 1, wherein the first conducting member is a grounding cable and the second conducting member is a conducting wire.

8. The clamp assembly of claim 1, wherein the first projection includes a first portion defining a portion of the first channel, and a second portion coupled to the first clamp member.

9. The clamp assembly of claim 8, wherein the first portion of the first projection is positioned between the first side of the body and the second portion of the first projection.

10. The clamp assembly of claim 1, wherein the first projection includes a threaded surface for securing the first clamp member via a threaded connection.

11. A clamp assembly comprising:
a body having a first side and a second side, the body including a first channel, a second channel, a first pair of projections extending from the first side of the body, and a second pair of projections extending from the second side of the body, the first channel configured to receive a first conducting member, the second channel configured to receive a second conducting member, the first pair of projections defining at least a portion of the first channel, the second pair of projections defining at least a portion of the second channel;
a first clamp member coupled to at least one of the projections in the first pair of projections; and
a second clamp member coupled to at least one of the projections in the second pair of projections,
wherein the first conducting member is a first flat wire, the body and the first clamp member being configured to receive a second flat wire therebetween, the first flat wire being perpendicular to the second flat wire.

12. The clamp assembly of claim 11, wherein the first channel extends parallel to the second channel.

13. The clamp assembly of claim 11, wherein the first channel extends perpendicular to the second channel.

14. The clamp assembly of claim 11, wherein at least one projection of the first pair of projections includes a rectangular portion and a cylindrical portion and the first clamp member includes a recess and an aperture, the recess receiving the rectangular portion and the cylindrical portion extending through the aperture.

15. The clamp assembly of claim 11, wherein at least one projection of the second pair of projections includes a semi-circular portion and a cylindrical portion and the second clamp member includes a recess and an aperture, the recess receiving the semi-circular portion and the cylindrical portion extending through the aperture.

16. The clamp assembly of claim 11 further comprising a first fastener that secures the first clamp member to the body and a second fastener that secures the second clamp member to the body.

17. The clamp assembly of claim 11, wherein the first conducting member has a rectangular cross-section and the second conducting member has a round cross-section.

18. The clamp assembly of claim 11, wherein the first conducting member is a grounding cable and the second conducting member is a conducting wire.

19. A clamp assembly comprising:
a body having a first side and a second side, the body including a first channel, a second channel, a first projection extending from the first side of the body, and a second projection extending from the second side of the body, the first channel configured to receive a first conducting member, the second channel configured to receive a second conducting member, the first projection defining at least a portion of the first channel, the second projection defining at least a portion of the second channel;
a first clamp member coupled to the first projection; and
a second clamp member coupled to the second projection,
wherein the second projection includes a semi-circular portion and a cylindrical portion and the second clamp member includes a recess and an aperture, the recess receiving the semi-circular portion and the cylindrical portion extending through the aperture.

20. The clamp assembly of claim 19, wherein the first channel extends parallel to the second channel.

21. The clamp assembly of claim 19, wherein the first channel extends perpendicular to the second channel.

22. The clamp assembly of claim 19, further comprising a first fastener that secures the first clamp member to the body and a second fastener that secures the second clamp member to the body.

23. The clamp assembly of claim 19, wherein the first conducting member has a rectangular cross-section and the second conducting member has a round cross-section.

24. The clamp assembly of claim 19, wherein the first conducting member is a grounding cable and the second conducting member is a conducting wire.

* * * * *